(12) United States Patent
Luo et al.

(10) Patent No.: US 7,375,372 B2
(45) Date of Patent: May 20, 2008

(54) THIN FILM TRANSISTOR

(75) Inventors: Fang-Chen Luo, Hsinchu (TW);
Wan-Yi Liu, Hsinchu (TW);
Chieh-Chou Hsu, Kaohsiung (TW)

(73) Assignee: Au Optronics Corporation, Hsinchu (TW)

( * ) Notice: Subject to any disclaimer, the term of this patent is extended or adjusted under 35 U.S.C. 154(b) by 144 days.

(21) Appl. No.: 11/307,160

(22) Filed: Jan. 26, 2006

(65) Prior Publication Data

US 2006/0197087 A1 Sep. 7, 2006

Related U.S. Application Data

(60) Division of application No. 10/711,509, filed on Sep. 23, 2004, now Pat. No. 7,205,171, which is a continuation-in-part of application No. 10/777,564, filed on Feb. 11, 2004, now abandoned.

(51) Int. Cl.
*H01L 29/04* (2006.01)
(52) U.S. Cl. .............................. 257/57; 257/59; 257/72; 257/E29.289

(58) Field of Classification Search ................... 257/57, 257/59, 72, E29.289
See application file for complete search history.

(56) References Cited

U.S. PATENT DOCUMENTS

| | | | | |
|---|---|---|---|---|
| 6,683,333 B2 * | 1/2004 | Kazlas et al. | ............... | 257/197 |
| 2004/0046171 A1 * | 3/2004 | Lee et al. | ...................... | 257/66 |
| 2004/0188685 A1 * | 9/2004 | Lin et al. | ...................... | 257/66 |

* cited by examiner

*Primary Examiner*—Hsien-ming Lee
(74) *Attorney, Agent, or Firm*—Jianq Chyun IP Office

(57) ABSTRACT

A thin film transistor (TFT) and a manufacturing method thereof are provided. The thin film transistor (TFT) comprises a substrate, a gate, an inter-gate dielectric layer, a channel layer and source/drain regions. A gate is formed over the substrate. An inter-gate dielectric layer is formed over the substrate covering the gate. A doped amorphous silicon layer is formed over a portion of the inter-gate dielectric layer at least covering the gate to serve as channel layer. Next, source/drain regions are formed over the channel layer.

10 Claims, 3 Drawing Sheets

THIN FILM TRANSISTOR

CROSS-REFERENCE TO RELATED APPLICATION

This application is a divisional application of prior application Ser. No. 10/711,509, filed on Sep. 23, 2004, now U.S. Pat. No. 7,205,171. The prior application Ser. No. 10/711,509 is a continuation-in-part of a prior application Ser. No. 10/777,564, filed Feb. 11, 2004, which now is abandoned. All disclosures of these applications are incorporated herewith by reference.

BACKGROUND OF THE INVENTION

1. Field of the Invention

The present invention generally relates to a thin film transistor (TFT). More particularly, the present invention generally relates to a thin film transistor (TFT) having a lightly doped amorphous silicon channel layer.

2. Description of the Related Art

In recent years, a variety of macromedia electronic devices and products are drastically developed due to the rapid development of the semiconductor device and the user interface of the device. Conventionally, since the cathode ray tube (CRT) display device is low-cost and has high performance, it is widely used display device. However, as to the display device of the personal computer, the cathode ray tube (CRT) display has the disadvantages of large size and high power consumption. Accordingly, the liquid crystal display (LCD) being small, lightweight, use low operational voltage, low power consumption, radiation free and environmentally friendly, gradually replaced the conventional CRT display. In recent years, the liquid crystal display (LCD), for example, the thin film transistor (TFT) liquid crystal display (LCD) has become the main stream of the display devices.

In general, the conventional thin film transistor (TFT) may be classified into amorphous silicon thin film transistor (TFT) and polysilicon thin film transistor (TFT). It is noted that, the technology of low temperature polysilicon (LTPS) is different from the technology of conventional amorphous silicon ($\alpha$-Si). In the low temperature polysilicon (LTPS) technology, the electron mobility can be enhanced to more than 200 $cm^2$/V-sec. Therefore, the size of the thin film transistor (TFT) can be minimized, the aperture ratio of the display can be enhanced, and the power consumption can be reduced. However, because of the manufacturing process of the amorphous silicon thin film transistor (TFT) technology is well developed, simple and low-cost, the amorphous silicon thin film transistor (TFT) technology is still the main stream of the array of the display device.

FIG. 1 is a cross-sectional view schematically illustrating the structure of conventional amorphous silicon thin film transistor (TFT). Referring to FIG. 1, the thin film transistor (TFT) 100 includes a substrate 110, a gate 120, an inter-gate dielectric layer 130, a channel layer 140 and source/drain regions 150. The gate 120 is disposed on the substrate 110. The inter-gate dielectric layer 130 is disposed on the substrate and covers the gate 120. The channel layer 140 is disposed on a portion of the inter-gate dielectric layer 130 that at least covers the gate 120. The source/drain regions 150 are disposed on the channel layer 140 and are separated by a distance. When the gate 120 operates to supply an operating voltage to the channel layer 140, the source/drain regions 150 are electrically connected by the channel layer 140.

The manufacturing method of the channel layer 140 of the conventional thin film transistor (TFT) 100 includes the following steps. First, the substrate 110 is transported into a reaction chamber (not shown) and the substrate is subjected to a reaction gas mixture comprising of silane ($SiH_4$) and hydrogen ($H_2$) in the reaction chamber to form an intrinsic amorphous silicon layer. Next, the amorphous silicon layer is patterned to form the channel layer 140.

Accordingly, because the channel layer of the thin film transistor (TFT) is an intrinsic amorphous silicon layer, the electron mobility and the turning-on-current are not high enough when the thin film transistor is operated.

SUMMARY OF THE INVENTION

Accordingly, one object of the present invention is to provide a thin film transistor (TFT) and the manufacturing method thereof to increase the turning-on-current and the electron mobility of the channel region of the thin film transistor (TFT).

In accordance with the above objects and other advantages of the present invention, a manufacturing method of thin film transistor (TFT) is provided. The manufacturing method includes the following steps. First, a gate is formed over a substrate. Next, an inter-gate dielectric layer is formed over the substrate covering the gate. Next, a channel layer is formed covering over a portion of the inter-gate dielectric layer at least covering the gate. The channel layer comprises a lightly doped amorphous silicon layer. Next, source/drain regions are formed over the channel layer, wherein the source/drain regions are separated by a distance.

In an embodiment of the present invention, the channel layer comprises an N-type lightly doped amorphous silicon layer. In another embodiment of the invention, the channel layer may comprise a P-type lightly doped amorphous silicon layer.

In an embodiment of the present invention, the channel layer, for example but not limited to, doped with phosphorous atoms, and a concentration of phosphorous atoms in the channel layer is in a range of about 1E17 atom/$cm^3$ to about 1E18 atom/$cm^3$. In another embodiment of the invention, the channel layer is, for example but not limited to, doped with boron atoms, and a concentration of boron atoms in the channel layer is in a range of about 1E16 atom/$cm^3$ to about 5E17 atom/$cm^3$.

In an embodiment of the present invention, the channel layer is formed by performing, for example but not limited to, a chemical vapor deposition (CVD) process using a reaction gas mixture comprising silane ($SiH_4$), hydrogen and phosphine ($PH_3$), wherein a effective content ratio of phosphine ($PH_3$) is in a range of about 2.8E-7 to about 8E-6, wherein the effective content ratio of the phosphine ($PH_3$) is equal to the ratio of the content of phosphine ($PH_3$) to the total content of silane ($SiH_4$), hydrogen ($H_2$) and phosphine ($PH_3$).

In another embodiment of the present invention, the channel layer is formed by performing, for example but not limited to, a chemical vapor deposition (CVD) process using a reaction gas mixture comprising silane ($SiH_4$), hydrogen ($H_2$) and boroethane ($B_2H_6$), wherein a effective content ratio of the boroethane ($B_2H_6$) is in a range of about 5E-7 to about 1E-5, and wherein the effective content ratio of the boroethane ($B_2H_6$) is equal to the ratio of the content of boroethane ($B_2H_6$) to the total content of silane ($SiH_4$), hydrogen ($H_2$) and boroethane ($B_2H_6$).

In an embodiment of the present invention, the channel layer is formed by, for example but not limited to, forming a first lightly doped sub-amorphous silicon layer over a portion of the inter-gate dielectric layer at a first deposition rate, and forming a second lightly doped sub-amorphous silicon layer over the first lightly doped sub-amorphous silicon layer at a second deposition rate, wherein the first deposition rate is lower than the second deposition rate.

In an embodiment of the present invention, the method further includes, for example but not limited to, a step of forming an ohmic contact layer over the channel layer between the steps of forming the channel layer and the step of forming the source/drain regions.

In an embodiment of the present invention, the method further includes, for example but not limited to, a step of forming a protection layer over the substrate covering the source/drain regions, the channel layer and the inter-gate dielectric layer.

In accordance with above objects and other advantages of the present invention, a thin film transistor (TFT) is provided. The thin film transistor (TFT) includes a substrate, a gate, an inter-gate dielectric layer, a channel layer and source/drain regions. The gate is disposed over the substrate, and the inter-gate dielectric layer is disposed on the substrate and covers the gate. The channel layer is disposed over a portion of the inter-gate dielectric layer, wherein the channel covers the gate. The channel layer comprises a lightly doped amorphous silicon layer. The source/drain regions are disposed over the channel layer, wherein the source/drain regions are separated by a distance.

In an embodiment of the present invention, the channel layer comprises an N-type lightly doped amorphous silicon layer. In another embodiment of the invention, the channel layer may comprise a P-type lightly doped amorphous silicon layer.

In an embodiment of the present invention, the channel layer is, for example but not limited to, doped with phosphorous atoms, and a concentration of phosphorous atoms in the channel layer is in a range of about $1E17$ atom/cm$^3$ to about $1E18$ atom/cm$^3$. In another embodiment of the invention, the channel layer is, for example but not limited to, doped with boron atoms, and a concentration of boron atoms in the channel layer is in a range of about $1E16$ atom/cm$^3$ to about $5E17$ atom/cm$^3$.

In an embodiment of the present invention, the method of forming the channel layer includes, for example but not limited to, a first lightly doped sub-amorphous silicon layer and a second lightly doped sub-amorphous silicon layer. Wherein the first lightly doped sub-amorphous silicon layer is formed over a portion of the inter-gate dielectric layer at a first deposition rate, and the second lightly doped sub-amorphous silicon layer is formed over the first lightly doped sub-amorphous silicon layer at a second deposition rate. Furthermore, the second deposition rate is higher than the first deposition rate.

In an embodiment of the present invention, the TFT further includes, for example but not limited to, an ohmic contact layer disposed between the channel layer and the source/drain.

In an embodiment of the present invention, the TFT further includes, for example but not limited to, a protection layer disposed over the substrate covering the source/drain regions, the channel layer and the inter-gate dielectric layer.

According to an aspect of the present invention, a lightly doped amorphous silicon layer is provided as a channel layer achieve at least the advantages of increased electron mobility of the channel layer and thereby increase the turning-on-current of thin film transistor (TFT) without increasing the leakage current, and the improvement of the ohmic contact between the channel layer and the source/drain regions.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
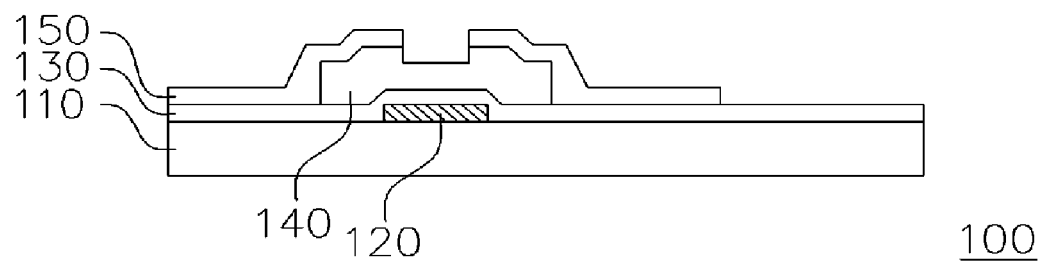
FIG. 1 is a cross-sectional view schematically illustrating the structure of a conventional amorphous silicon thin film transistor (TFT).
Figure 2A:
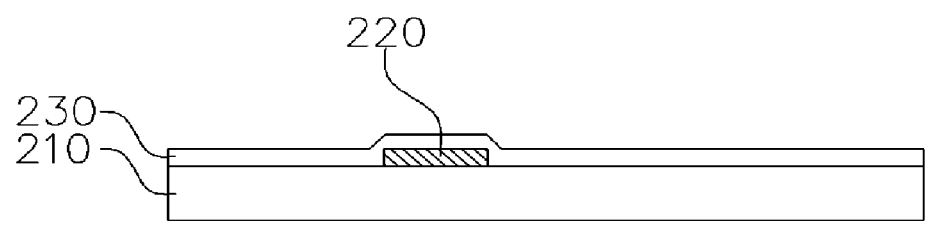
FIG. 2A to FIG. 2F are cross-sectional views schematically illustrating the process flow of a process of forming a thin film transistor (TFT) according to a preferred embodiment of the present invention.

FIG. 2A to FIG. 2F are cross-sectional views schematically illustrating the process flow of a process of forming a thin film transistor (TFT) according to a preferred embodiment of the present invention. As shown in FIG. 2A, a gate 220 is formed over a substrate 210. Next, an inter-gate dielectric layer 230 is formed over the substrate 210 at least covering the gate 220. The method of forming the gate 220 includes, for example but not limited to, forming a first conductive layer (Metal 1) over the substrate 210 by performing a sputtering process, and then performing well known photolithography and etching process to form the gate 220. The inter-gate dielectric layer 230 can be formed by, for example but not limited to, performing a plasma enhance chemical vapor deposition (PECVD) process.

Furthermore, the substrate 210 includes, for example but not limited to, a glass substrate, a transparent plastic substrate or a substrate composed of any transparent material. The material of the gate 220 includes, for example but not limited to, tantalum (Ta), chromium (Cr), molybdenum (Mo), titanium (Ti) or aluminum (Al) or other conductive material. The material of the inter-gate dielectric layer 230 includes, for example but not limited to silicon nitride (SixNy), silicon oxynitride (SiON), silicon oxide (SiOx) or other dielectric material.

Figure 2B:
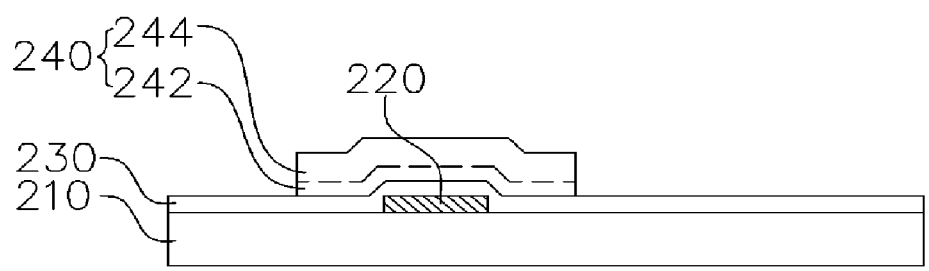

Next, as shown in FIG. 2B, a channel layer 240 is formed over a portion of the inter-gate dielectric layer 230 at least covering the gate 220. The channel layer 240 comprises, for example but not limited to, lightly doped amorphous silicon layer, wherein the doped amorphous silicon layer comprises an N-type lightly doped amorphous silicon layer or P-type lightly doped amorphous silicon layer. The channel layer 240 can be formed by performing, for example but not limited to, a chemical vapor deposition (CVD) process. The CVD process includes, for example, transporting the substrate 210 into a reaction chamber (not shown). Next, a reaction gas mixture is charged into the reaction chamber, wherein the reaction gas mixture comprises, for example but not limited, silane ($SiH_4$), hydrogen ($H_2$) and phosphine ($PH_3$). Alternatively, the reaction gas mixture may comprise silane ($SiH_4$), hydrogen ($H_2$) and boroethane ($B_2H_6$). For the reaction gas comprising phosphine ($PH_3$), the effective content ratio of the phosphine ($PH_3$) is, for example but not limited to, in a range of about 2.8E-7 to about 8E-6. And, for the reaction gas comprising boroethane ($B_2H_6$), the effective content ratio of the boroethane ($B_2H_6$) is, for example but not limited to, in a range of about 5E-7 to about 1E-5. The effective content ratio of the phosphine ($PH_3$) is equal to the ratio of the content of phosphine ($PH_3$) to the total content of silane ($SiH_4$), hydrogen and phosphine ($PH_3$). The effective content ratio of the boroethane ($B_2H_6$) is equal to the ratio of the content of boroethane ($B_2H_6$) to the total content of silane ($SiH_4$), hydrogen and boroethane ($B_2H_6$).

In an embodiment of the present invention, the channel layer 240 is, for example but not limited to, doped with phosphorous atoms. The concentration of phosphorous atoms is, for example but not limited to, in a range of about $1E17$ atom/$cm^3$ to $1E18$ atom/$cm^3$. Alternatively, the channel layer 240 is, for example but not limited to, doped with boron atoms. The concentration of boron atoms is, for example but not limited to, in a range of about $1E16$ atom/$cm^3$ to $5E17$ atom/$cm^3$.

The method of forming the channel layer 240 is described as follows. First, a first lightly doped sub-amorphous silicon layer 242 is formed over a portion of the inter-gate dielectric layer 230 at least covering the gate 220 at a first deposition rate. Next, a second lightly doped sub-amorphous silicon layer 244 is formed over the first lightly doped sub-amorphous silicon 242 at a second deposition rate. In an embodiment of the invention, the first deposition rate is, lower than the second deposition rate.

Figure 2C:
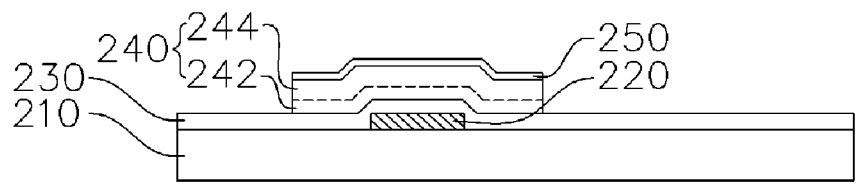

Next, as shown in FIG. 2C, an ohmic contact layer 250 is formed over the channel layer 240, wherein the ohmic contact layer 250 has an excellent contact with a metal surface. The method of forming the ohmic contact layer 250 includes, for example but not limited to, performing an ion implant process to implant N-type ions into the amorphous silicon layer.

Figure 2D:
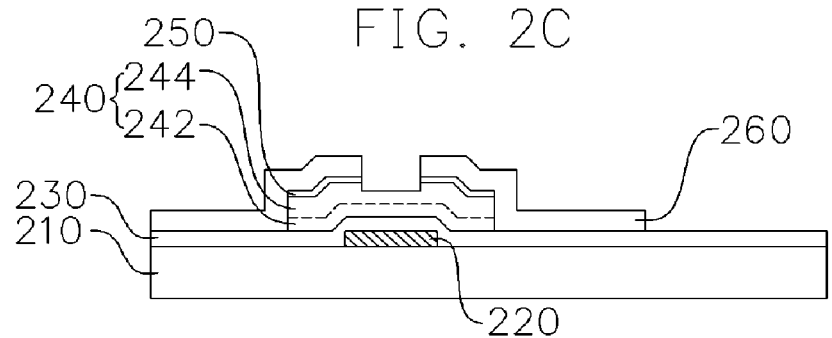

Next, as shown in FIG. 2D, source/drain regions 260 are formed over the channel layer 240. The forming method of source/drain regions 260 includes, for example but not limited to, first forming a second conductive layer (Metal 2) over the substrate 210, and then performing the well known photolithography and etching process to form the source/drain regions 260. The material of the source/drain regions 260 includes, for example but not limited to, tantalum (Ta), chromium (Cr), molybdenum (Mo), titanium (Ti), aluminum (Al), or other conductive material.

Figure 2E:
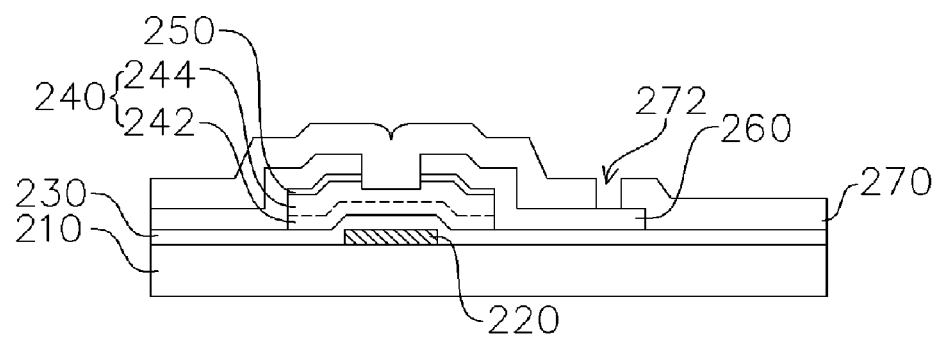

Next, as shown in FIG. 2E, a protection layer 270 is formed over the substrate 210 to cover the source/drain regions 260, the channel layer 240 and the inter-gate dielectric layer 230. The protection layer 270 comprises an opening 272 exposing a portion of the source/drain region 260 there-within.

Figure 2F:
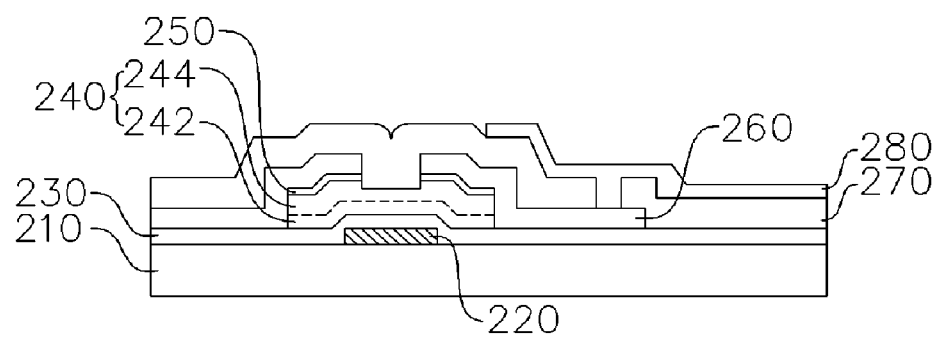

Next, as shown in FIG. 2F, a transparent conductive layer 280 is formed over the protection layer 270 and electrically connected to the source/drain region 260 through the opening 272. The transparent conductive layer 280 includes, for example but not limited to, a pixel electrode. The material of the transparent conductive layer 280 includes, for example but not limited to, indium tin oxide (ITO), strontium tin oxide (STO), or other transparent conductive material.

Referring to FIG. 2E, a structure of the thin film transistor (TFT) 200 of the present invention is shown. The TFT comprises a substrate 210, a gate 220, an inter-gate dielectric layer 230, a channel layer 240 and source/drain regions 260. The gate 220 is disposed over the substrate 210. The inter-gate dielectric layer 230 is disposed over the substrate 210 and covers the gate 220. The channel layer 240 is disposed over a portion of the inter-gate dielectric layer 230 at least covering the gate 210. The material of the channel layer 240 includes, for example, a lightly doped amorphous silicon layer. The source/drain regions 260 are disposed over the channel layer 240, wherein the source/drain are separated by a distance.

Furthermore, the channel layer 240 comprises, for example but not limited to, an N-type lightly doped amorphous silicon layer or P-type lightly doped amorphous silicon layer.

Furthermore, the channel layer 240 is, for example but not limited to, doped with phosphorous atoms, and the concentration of phosphorous atoms in the channel layer 240 is, for example but not limited to, in a range of about $1E17$ atom/$cm^3$ to about $1E18$ atom/$cm^3$. Alternatively, the channel layer 240 is, for example but not limited to, boron atoms, and the concentration of boron atoms in the channel layer 240 is, for example but not limited to, in a range of about $1E16$ atom/$cm^3$ to about $5E17$ atom/$cm^3$.

Moreover, the channel layer 240 can be formed by, for example but not limited to, sequentially forming a first lightly doped sub-amorphous silicon layer 242 and a second lightly doped sub-amorphous silicon layer 244 over the inter-gate dielectric layer 220. The first lightly doped sub-amorphous silicon layer 242 is disposed, for example but not limited to, on a portion of the inter-gate dielectric layer 220 that at least covers the gate 210. The second lightly doped sub-amorphous silicon layer 244 is disposed, for example but not limited to, on the first lightly doped sub-amorphous silicon layer 242.

Moreover, the thin film transistor (TFT) 210 further includes, for example but not limited to, an ohmic contact layer 250 and a protection layer 270 formed over the substrate 210. The ohmic contact layer 250 is disposed, for example but not limited to, between the channel layer 240 and the source/drain regions 260 to enhance the ohmic contact the channel layer 240 and the source/drain regions 260. The protection layer 270 is disposed on, for example but not limited to, the substrate 210, and the protection layer 270 covers the source/drain regions 260, the channel layer 240 and the inter-gate dielectric layer 220.

However, it is noted that, the above-described thin film transistor (TFT) and the manufacturing method thereof of the embodiments of the present invention is provided as exemplary embodiments of the invention. Further, the use of channel layer composed of lightly doped amorphous silicon layer in a thin film transistor (TFT) and the process of forming the same in a TFT falls within the scope of the present invention.

Figure 3:
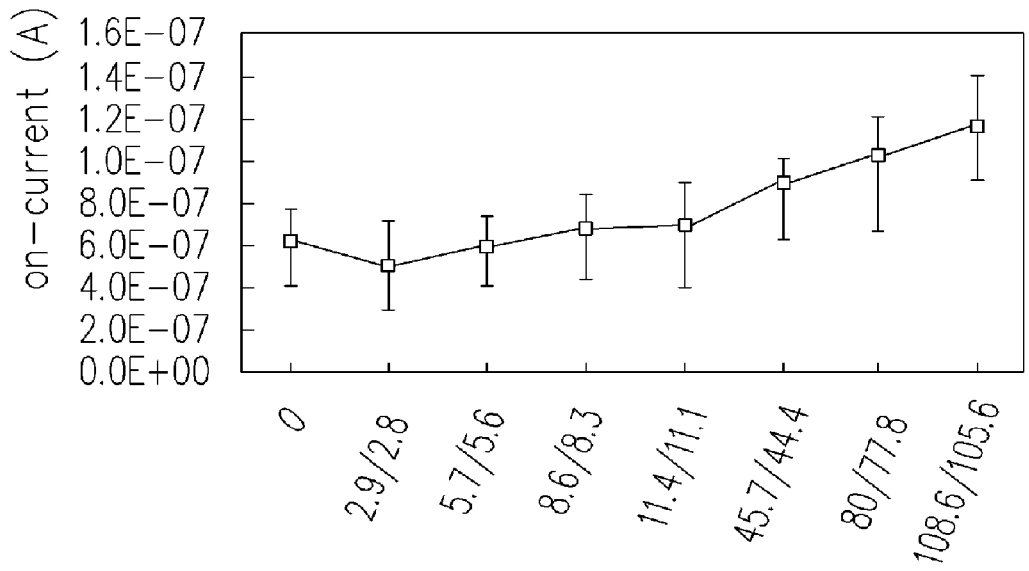
FIG. 3 is a plot illustrating the relationship between the turning-on-current and the effective content ratio of the phosphine ($PH_3$) in the process of forming the thin film transistor (TFT) according to one of the preferred embodiment of the present invention.
Figure 4:
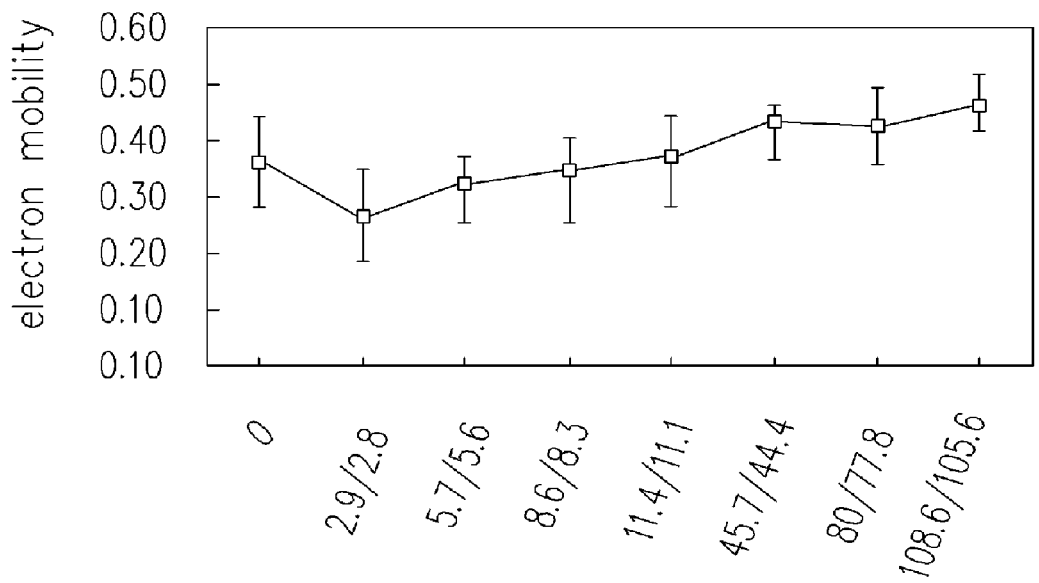
FIG. 4 is a plot illustrating the relationship between the electron mobility and the effective content ratio of the phosphine ($PH_3$) in the process of forming the thin film transistor (TFT) according to one of the preferred embodiment of the present invention.

FIG. 3 is a plot illustrating the relationship between the turning-on-current and the effective content ratio of phosphine ($PH_3$) in the process of forming the thin film transistor (TFT) according to one of the preferred embodiment of the present invention. FIG. 4 is a plot illustrating the relationship between the electron mobility and the effective content ratio of phosphine ($PH_3$) in the process of forming the thin film transistor (TFT) according to one of the preferred embodiment of the present invention. As shown in FIG. 3, the turning-on-current of the thin film transistor (TFT) increases drastically with the increasing effective content ratio of the phosphine ($PH_3$) in presence of the channel layer. As shown in FIG. 4, the electron mobility of the channel layer of the thin film transistor (TFT) drastically increases with the increasing effective content ratio of the phosphine ($PH_3$) in presence of the channel layer. In FIG. 3 and FIG. 4, the parameter (2.9/2.8) means that the effective content ratio of the phosphine ($PH_3$) is 2.9*1E-7 when fabricating the first lightly doped sub-amorphous layer, and the effective content ratio of the phosphine ($PH_3$) is 2.8*1E-7 when fabricating the second lightly doped sub-amorphous layer. Similarly, the parameter (5.7/5.6) means that the effective content ratio of the phosphine ($PH_3$) is 5.7*1E-7 when fabricating the first lightly doped sub-amorphous layer, and the effective content ratio of the phosphine ($PH_3$) is 5.6*1E-7 when fabricating the second lightly doped sub-amorphous layer. Moreover, the rest parameters such as (8.6/8.3), (11.4/11.1), (54.7/44.4), (80/77.8) and (108.6/105.6) are explained in the same way. For example, the effective content ratio of phosphine ($PH_3$) X is calculated as follow. $X_{PH3}=(R_{PH3}*W_{PH3})/((R_{PH3}*W_{PH3})+(R_{H2}*W_{H2})+(R_{SiH4}*W_{SiH4}))$, wherein $R_{PH3}$ is the flow rate of phosphine; $W_{PH3}$ is the weight percent of phosphine; $R_{H2}$ is the flow rate of hydrogen; $W_{H2}$ is the weight percent of hydrogen; $R_{SiH4}$ is the flow rate of silane; and $W_{SiH4}$ is the weight percent of silane.

Furthermore, the TFT of the present invention was tested, the test results reveal that the TFT of the present invention do not have excess the leakage current, and the ohmic contact between the channel layer and the source/drain is substantially improved.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A thin film transistor (TFT), comprising:
   a substrate;
   a gate, disposed over the substrate;
   an inter-gate dielectric layer, disposed over the substrate covering the gate;
   a channel layer, disposed over a portion of the inter-gate dielectric layer, at least over the gate, wherein the channel layer comprises a lightly doped amorphous silicon layer, and the lightly doped amorphous silicon layer comprises:
      a first lightly doped sub-amorphous silicon layer, disposed over a portion of the inter-gate dielectric layer; and
      a second lightly doped sub-amorphous silicon layer, disposed over the first lightly doped sub-amorphous silicon layer, wherein the effective content ratio of the dopants in the first lightly doped sub-amorphous silicon layer and the effective content ratio of the dopants in the second lightly doped sub-amorphous silicon layer are substantially different; and
   source/drain regions, disposed over the channel layer, wherein the source/drain regions are separated by a distance.

2. The thin film transistor (TFT) of claim 1, wherein the channel layer comprises an N-type lightly doped amorphous silicon layer.

3. The thin film transistor (TFT) of claim 1, wherein the channel layer comprises a P-type lightly doped amorphous silicon layer.

4. The thin film transistor (TFT) of claim 1, wherein the channel layer is doped with phosphorous atoms, and a concentration of phosphorous atoms is in a range of about $1E17 atom/cm^3$ to about $1E18 atom/cm^3$.

5. The thin film transistor (TFT) of claim 1, wherein the channel layer is doped with boron atoms, and a concentration of boron atoms is in a range of about $1E16 atom/cm^3$ to about $5E17 atom/cm^3$.

6. The thin film transistor (TFT) of claim 1, wherein the first lightly doped sub-amorphous silicon layer is formed at a first deposition rate, and the second lightly doped sub-amorphous silicon layer is formed at a second deposition rate higher than the first deposition rate.

7. The thin film transistor (TFT) of claim 1, further comprising an ohmic contact layer between the channel layer and the source/drain regions.

8. The thin film transistor (TFT) of claim 1, further comprising a protection layer over the substrate, wherein the protection layer covers the source/drain regions, the channel layer and the inter-gate dielectric layer.

9. The thin film transistor (TFT) of claim 1, wherein (the effective content ratio of the dopants in the first lightly doped sub-amorphous silicon layer)/(the effective content ratio of the dopants in the second lightly doped sub-amorphous silicon layer) is substantially equal to or greater than 8.6/8.3.

10. The thin film transistor (TFT) of claim 9, wherein the dopants comprises phosphine.

* * * * *